US009972562B2

(12) United States Patent
Fontana

(10) Patent No.: US 9,972,562 B2
(45) Date of Patent: May 15, 2018

(54) SEMICONDUCTOR DEVICE AND CORRESPONDING METHOD

(71) Applicant: STMICROELECTRONICS S.R.L., Agrate Brianza (IT)

(72) Inventor: Fulvio Vittorio Fontana, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days. days.

(21) Appl. No.: 15/471,472

(22) Filed: Mar. 28, 2017

(65) Prior Publication Data

US 2018/0053713 A1 Feb. 22, 2018

(30) Foreign Application Priority Data

Aug. 22, 2016 (IT) .......................... 102016000086488

(51) Int. Cl.
*H01L 23/495* (2006.01)
*H01L 21/48* (2006.01)

(52) U.S. Cl.
CPC .... *H01L 23/49568* (2013.01); *H01L 21/4825* (2013.01); *H01L 21/4842* (2013.01); *H01L 23/4952* (2013.01); *H01L 23/49503* (2013.01); *H01L 23/49575* (2013.01)

(58) Field of Classification Search
CPC ............. H01L 21/4825; H01L 23/4952; H01L 23/49575; H01L 23/49568; H01L 23/49503; H01L 21/4842; H01L 2224/48227
See application file for complete search history.

(56) References Cited

U.S. PATENT DOCUMENTS

| 5,936,303 A | 8/1999 | Nishi | |
|---|---|---|---|
| 2010/0078802 A1* | 4/2010 | Pan .................... | H01L 23/49531 257/692 |
| 2010/0213588 A1* | 8/2010 | Hsieh ................ | H01L 23/49816 257/676 |
| 2011/0068448 A1 | 3/2011 | Camacho et al. | |
| 2014/0239472 A1* | 8/2014 | Jones ...................... | H01L 24/49 257/676 |

OTHER PUBLICATIONS

Otsuka, K. et al., "High-Performance Small IC Package," Hitachi Review 41(2):113-118, May 1992.

\* cited by examiner

*Primary Examiner* — Jasmine Clark
(74) *Attorney, Agent, or Firm* — Seed IP Law Group LLP

(57) ABSTRACT

A semiconductor device includes: a semiconductor die having first and second opposite surfaces, a die pad having the first surface of the semiconductor die attached thereon, an electrically conductive ground pad at the second surface of the semiconductor die, a device package coupled with the semiconductor die with the ground pad lying between the semiconductor die and the package, and ground wiring or tracks for the semiconductor die between the second surface of the semiconductor die and the ground pad. A further ground connection may be provided between the ground pad at the second surface of the semiconductor die and the die pad having the semiconductor die attached thereon.

18 Claims, 8 Drawing Sheets

FIG. 3
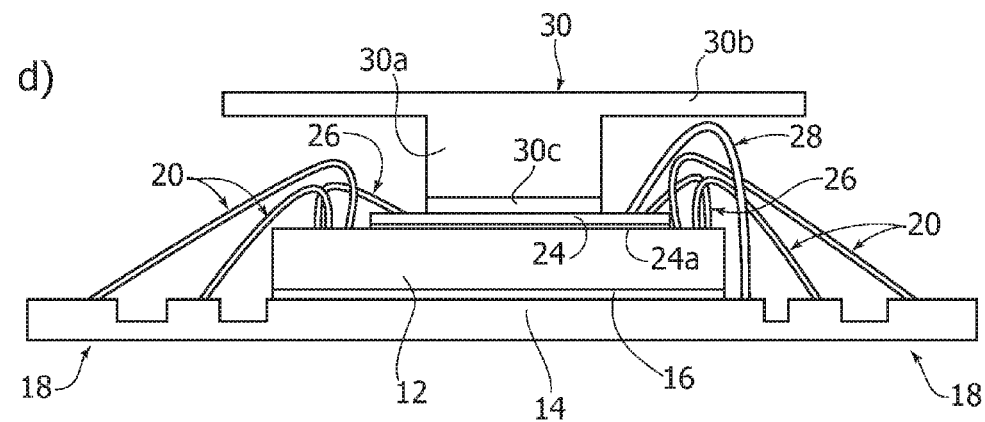
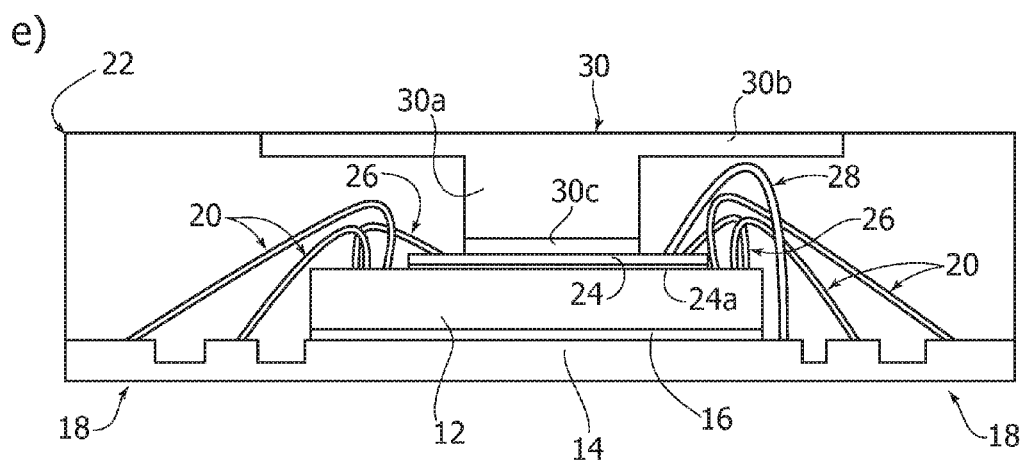
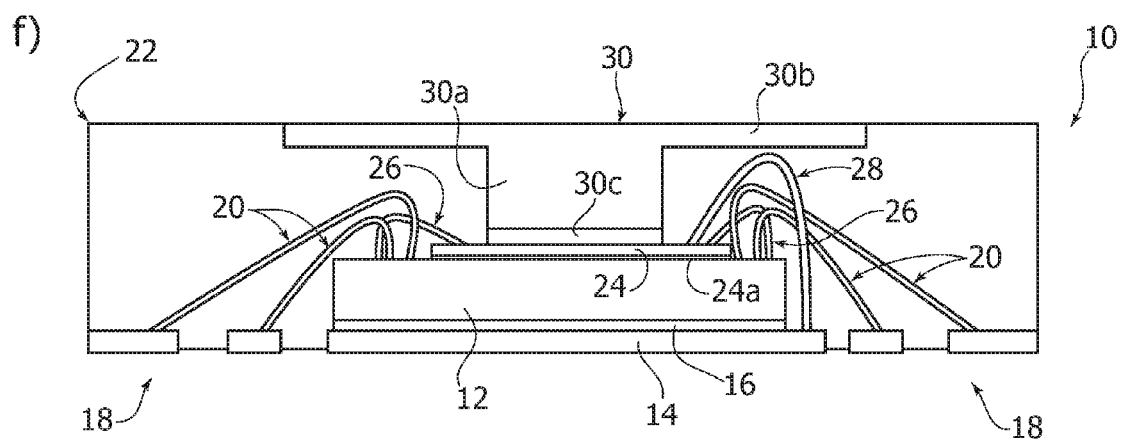

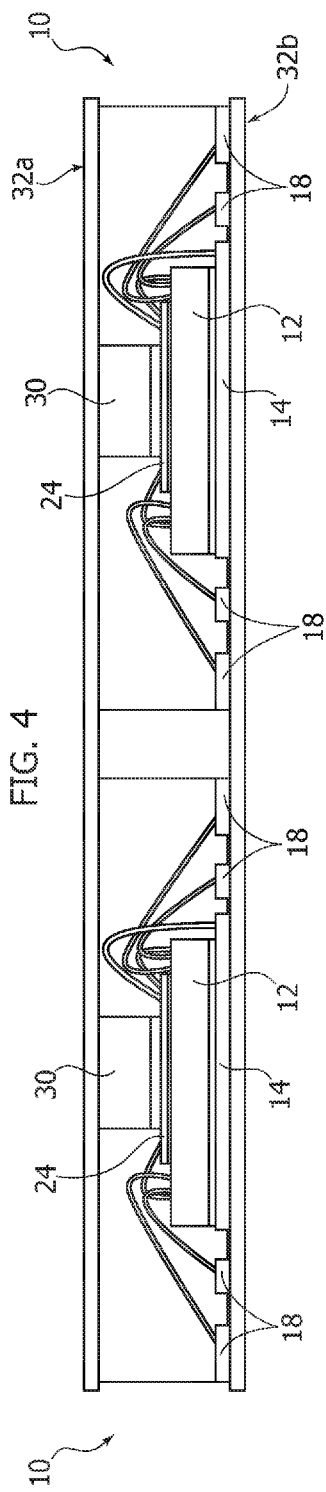
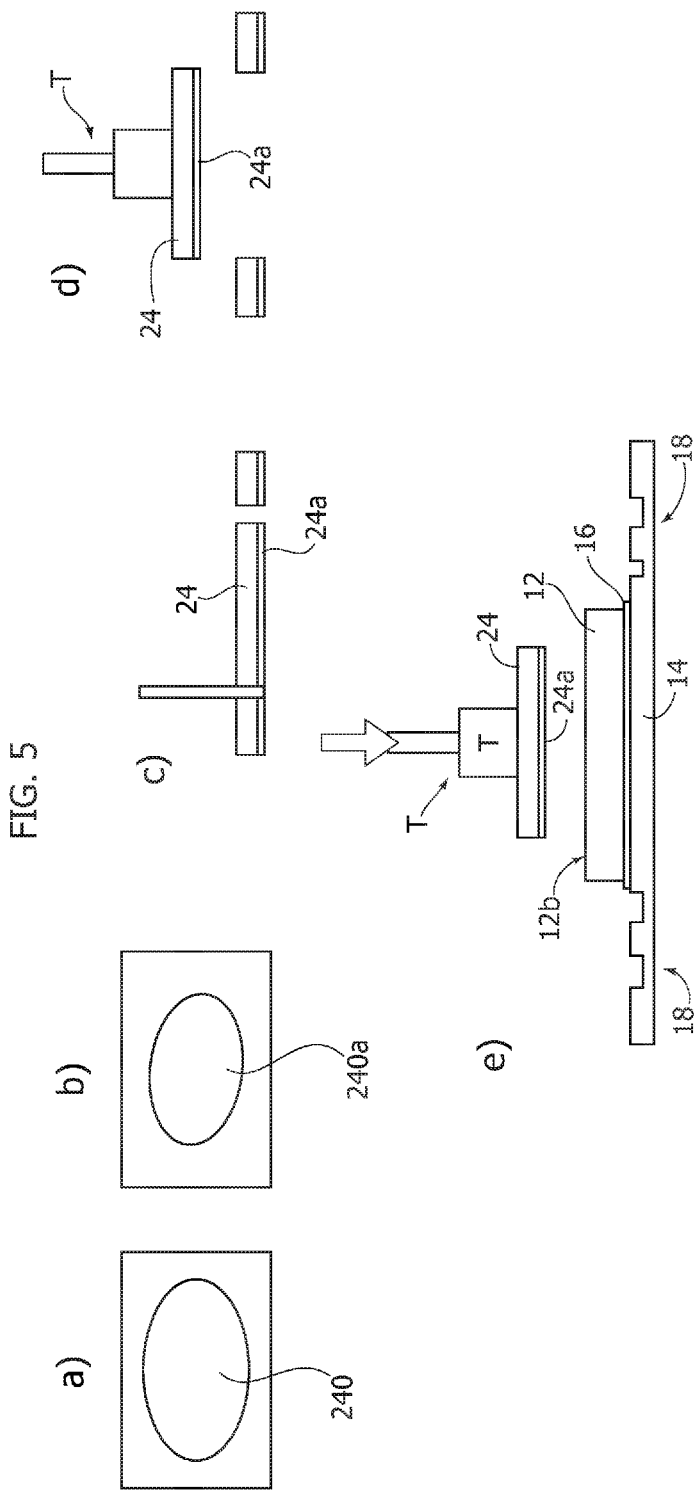
FIG. 4
FIG. 5

SEMICONDUCTOR DEVICE AND CORRESPONDING METHOD

BACKGROUND

Technical Field

The description relates to semiconductor devices.

One or more embodiments may apply to semiconductor devices including "lead frame" module packages.

Semiconductor devices such as integrated circuits of the Quad Flat No-leads (QFN), Quad Flat Package (QFP) and Thin Small Outline Package (TSOP) types may be exemplary of such semiconductor devices.

Description of the Related Art

Various semiconductor devices may include a package (e.g., plastic/resin compound) on a lead frame, with die and ground pads connected by means of multiple bonding wires to a ground ring.

This may include, e.g., a metal structure integrated in the lead frame or bonded to a lead frame lead.

It was noted that, by dispensing with such ground ring, the dimensions of the lead frame (and of the package as a whole) may be reduced, by avoiding the risk of delamination between the package compound (e.g., resin) and such a ground ring: this may include a final metallization (such as NiAu or Ag) which, while compatible with wire bonding, may exhibit reduced compatibility with a plastic molding compound.

BRIEF SUMMARY

One or more embodiments reduce the ratio between package dimension and die dimension ratio, while possibly improving ground bonding reliability.

One or more embodiments include a semiconductor device that includes a semiconductor die having first and second opposite surfaces, a die pad, the first surface of the semiconductor die being attached on the die pad, an electrically conductive ground pad at the second surface of the semiconductor die, a device package coupled with the semiconductor die with said ground pad lying between the semiconductor die and the package, and a first ground connection electrically connecting the second surface of the semiconductor die and said ground pad.

One or more embodiments may also relate to a corresponding method.

The claims are an integral part of the technical teaching provided herein in respect of the embodiments.

One or more embodiments may involve providing (e.g., by making or attaching) a conductive ground pad on the semiconductor die, for instance close to the center thereof; ground connection(s) from the semiconductor die may then be provided (e.g., bonded) to such a ground pad, with the ground pad in turn connected (e.g., via a single wire) to a lead frame ground.

In one or more embodiments, the ground wires from the semiconductor die may be bonded with the ground pad at the top or front surface of the semiconductor die, rather than in the pad area; a ground ring may thus be dispensed with, with the ensuing capability of reducing the package size.

In one or more embodiments the ground pad may include a conductive material such as copper, aluminum, silver or, possibly, carbon, with the ground pads of the semiconductor die wire-bonded to such a ground pad, this latter being electrically connected, e.g., with a single wire to a ground contact in the lead frame.

In one or more embodiments, the shape of the ground pad can be configured in such a way as to reduce the ground wire length, while also increasing the pad surface to improve thermal dissipation.

One or more embodiments may be applied to various types of a semiconductor devices including a lead frame packaging such as, e.g., QFN, QFP, TSOP.

One or more embodiments make it possible to assembly larger dies in a smaller packaging by reducing the die pad dimensions. For instance a 4.0×3.6 semiconductor die currently assembled on a 9×9 QFN may be assembled on a 7×7 QFN, by possibly reducing packaging costs by about 30%.

In one or more embodiments, resorting to a "top" ground (conductive) pad solution may improve packaging reliability. For instance, wires bonded on such a top ground pad may have a distance between the pad connection (stitch) and the center of the packaging of, e.g., 1.2 mm on a 7×7 QFN: this is shorter than a corresponding wire bonding distance on a ground ring (e.g., 2.0 mm), so that thermo-mechanical stresses applied to the pad connection (stitch) may be lower, thus reducing the risk of wire crack.

BRIEF DESCRIPTION OF THE SEVERAL VIEWS OF THE DRAWINGS

One or more embodiments will now be described, by way of example only, with reference to the annexed figures, wherein:

FIG. 4 is a sectional view exemplary of embodiments, FIG. 5, including five portions, a) to e), is representative of possible steps in producing a semiconductor device according to embodiments, FIG. 6, including two portions, a) and b), is exemplary of possible steps in producing a semiconductor device according to embodiments, FIG. 7, including five portions, a) to e), is exemplary of possible steps in producing a semiconductor device according to embodiments.

It will be appreciated that, for the sake of clarity and ease of representation, the various figures may not be drawn to a same scale. Also, features and details exemplified in connection with one of the figures may be applied also to embodiments as exemplified in other figures.

DETAILED DESCRIPTION

In the ensuing description, one or more specific details are illustrated, aimed at providing an in-depth understanding of examples of embodiments of the instant description. The embodiments may be obtained by one or more of the specific details or with other methods, components, materials, and so on. In other cases, known structures, materials or operations are not illustrated or described in detail so that certain aspects of embodiment will not be obscured.

Reference to "an embodiment" or "one embodiment" in the framework of the present description is intended to indicate a particular configuration, structure, characteristic described in relation to the embodiment is compliance in at least one embodiment. Hence, phrases such as "in an embodiment" or "in one (or more) embodiments" that may be present in one or more points in the present description do not necessarily refer to one and the same embodiment. Moreover, particular conformation, structures or characteristics as exemplified in connection with any of the figures may be combined in any other quite way in one or more embodiments as possibly exemplified in other figures.

The references used herein are provided merely for convenience and hence do not define the extent of protection or the scope of the embodiments.

Figure 1:
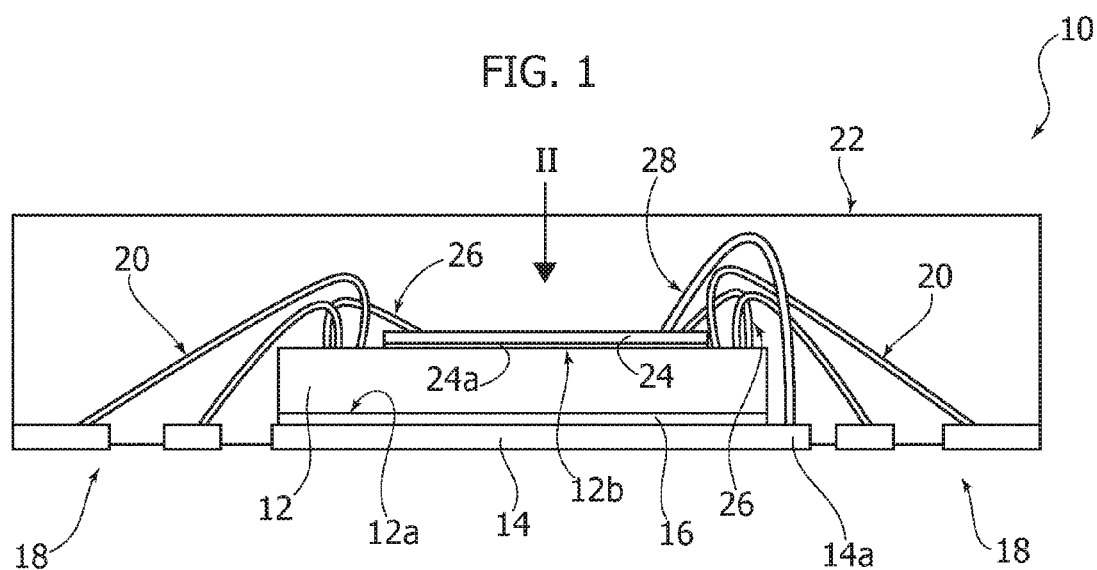
FIG. 1 is a sectional view of a semiconductor device according to embodiments.

In FIG. 1, a semiconductor device such as, e.g., an integrated circuit, is generally indicated by the reference numeral 10.

In one or more embodiments, the semiconductor device 10 may be of a type involving lead frame module packaging.

Semiconductor devices of the QFN (Quad Flat No-leads), QFP (Quad Flat Package) or TSOP (Thin Small Outline Package) types may be exemplary of such semiconductor devices.

In one or more embodiments, the semiconductor device 10 may include a semiconductor die or chip 12 having first and second opposite surfaces 12a, 12b.

Reference numeral 14 denotes a die pad which supports the semiconductor die 12, e.g., with the (e.g., metal) die pad 14 having the first (bottom or back) surface 12a of the semiconductor die 12 attached thereon by a film 16. This may be, e.g., via a die attach film (DAF), e.g., of an electrically insulating type.

In one or more embodiments, an array of leads 18 may be provided around the die pad 14 to form a so-called lead frame (LF).

In one or more embodiments, a (first) network of bonding wires 20 including, e.g., copper wires, may provide electrical connection of the semiconductor die 12 to the leads 18 of the lead frame. This may include, e.g., bonding wires 20 extending from wire bonding pads at the second (top or front) surface of the die 12 to respective leads of the lead frame.

A device package 22 may then be provided including, e.g., a package molding compound (PMC), such as an electrically insulating resin, to embed the other components of the semiconductor device 10.

The general layout discussed in the foregoing is otherwise conventional in the art, thus making it unnecessary to provide a more detailed description herein.

In one or more embodiments, an electrically conductive (e.g., metal) ground pad 24 may be provided at the second (top or front) surface 12b of the semiconductor die 12 so that the ground pad 24 may lie (sandwiched, de facto embedded) between the semiconductor die 12 and the package 22.

In one or more embodiments, a set of ground connections (e.g., a network of wires 26—see, e.g., FIG. 1 or a set of ground tracks 27—see, e.g., FIG. 8) may be provided between ground terminals of the semiconductor die (located, e.g., at the upper or front surface 12b thereof) and the ground pad 24.

Figure 2:
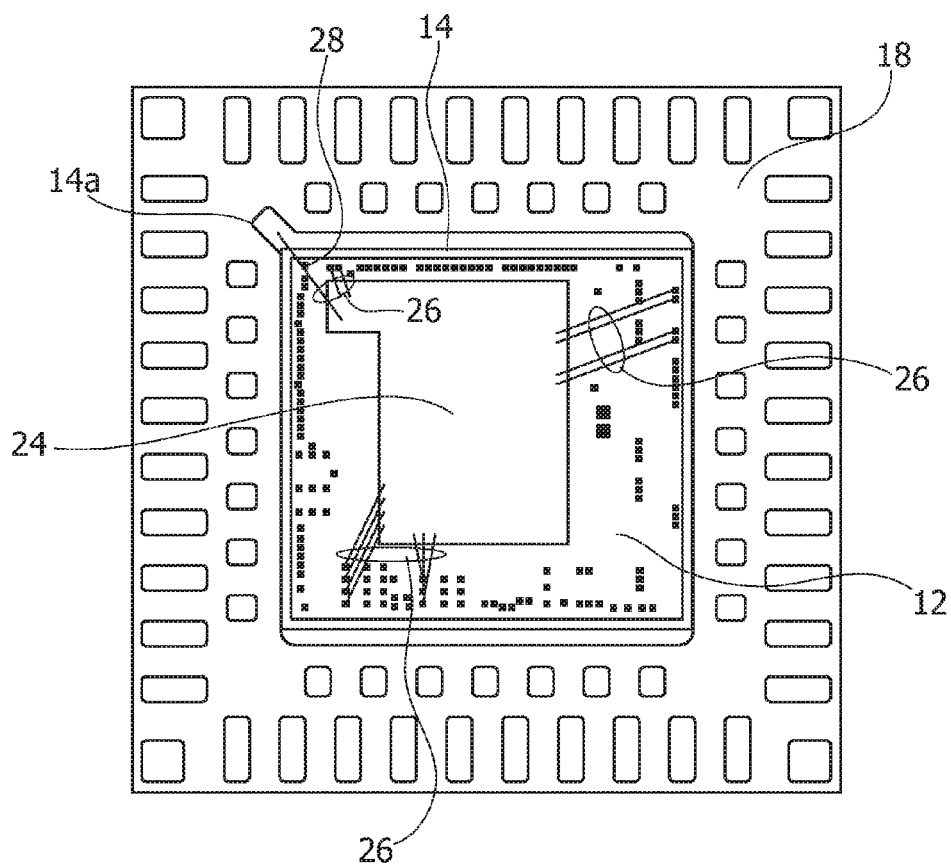
FIG. 2 is a plan view essentially corresponding to arrow II in FIG. 1, FIG. 3, including six portions, a) to f), is representative of possible steps in producing a semiconductor device according to embodiments.

As visible in the plan view of FIG. 2 (where the first network of bonding wires 20 is not visible for the clarity of representation), the network of ground connections 26 to the ground pad 24 may follow any desired pattern, with the length of the associated wiring/tracks reduced to the length between the ground terminals of the semiconductor die 12 located at the surface 12b and the ground pad 24 extending over a portion of the same surface 12b.

The distance between the ground terminals on the top surface 12b and the center of the die 12 (and the package 22) being correspondingly reduced will result in lower thermo-mechanical stresses applied to the pad connections (stitches) with the risk of, e.g., wire crack correspondingly reduced.

As schematically represented in FIG. 2, the ground pad 24 may cover a portion of the top surface of the semiconductor die 12.

In one or more embodiments, the ground pad 24 may include conductive materials such as a metal (e.g., copper, aluminum, silver and so on) and possibly carbon.

In one or more embodiments, additional ground connection 28 (possibly including a single ground wire) may be provided between the ground pad 24 and the die pad 14, e.g., at a lateral extension 14a thereof as shown in FIG. 2.

Stated otherwise, in one or more embodiments, the ground connections from the ground terminals at the top or front surface 12b of the semiconductor die 12 may be first "routed" via the first ground connections 26 towards the ground pad 24 to be then coupled from the ground pad 24 to the die pad 14 via the (possibly single wire) connection 28.

In one or more embodiments, the basic layout exemplified in FIGS. 1 and 2 may be developed along the lines exemplified in FIGS. 3A-3F, wherein parts or elements like parts or elements already discussed in connection with FIGS. 1 and 2 are indicated with like numerals, thus making it unnecessary to repeat a corresponding description.

Figure 3:
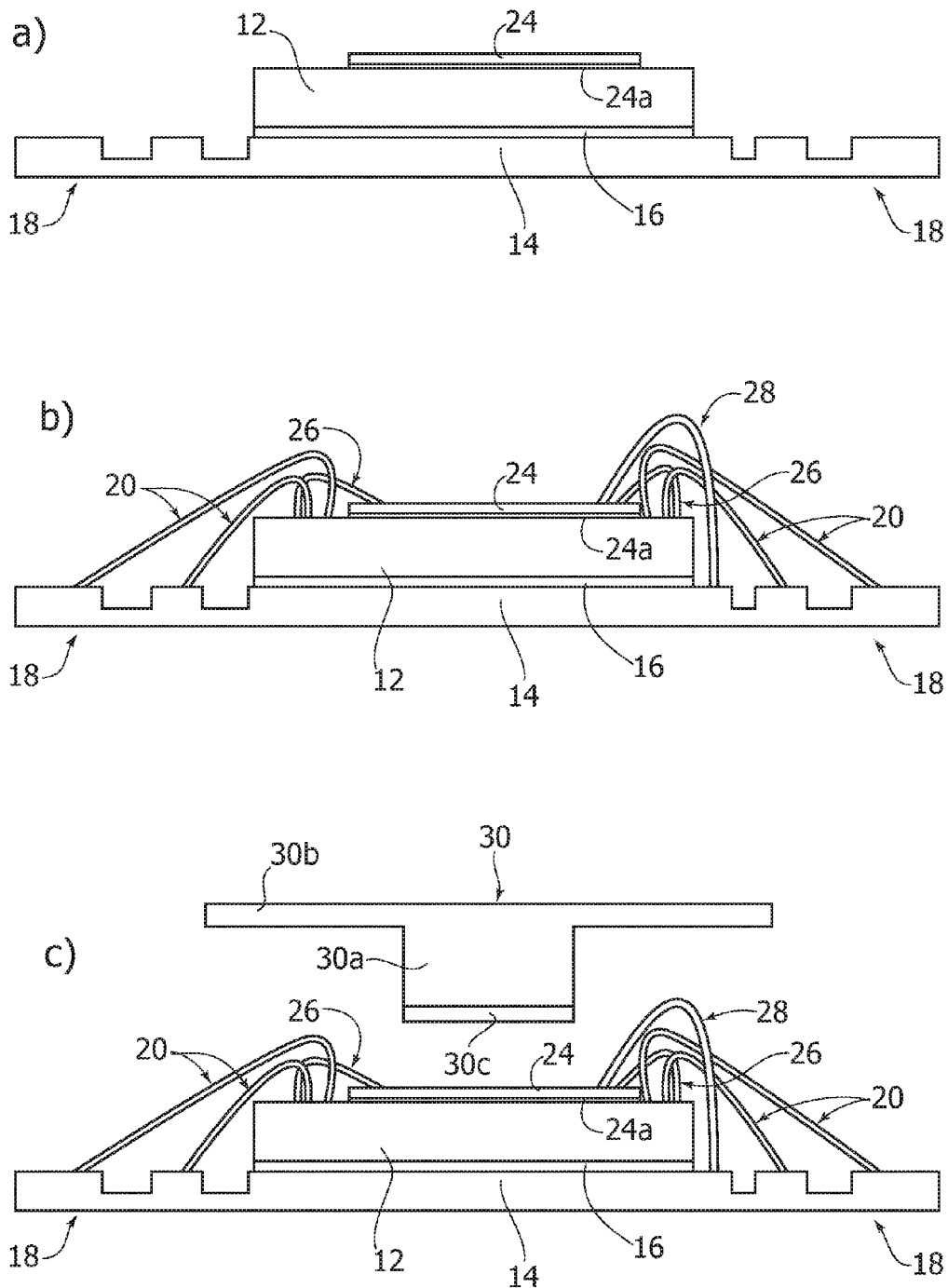

Briefly, in one or more embodiments, the die 12 may be attached (e.g., at 16) onto the die pad 14 which—at the outset of the sequence represented in FIGS. 3A-3F—may still be one-piece with the leads 18, to be then separated, e.g., by back etching as represented in FIG. 3F.

FIG. 3B is exemplary of the provision of the wire bonding 20 and the ground lines 26 and 28 as discussed in the foregoing.

FIG. 3C is exemplary of the possibility of coupling with the ground pad 24 a heat sink (heat exchanger) 30.

In one or more embodiments, the heat sink 30 may include a thermally conductive body optionally having a mushroom-like (T-shaped) shape and thus including a stem portion 30a and a head portion 30b.

In one or more embodiments, the heat sink 30 may be coupled with the ground pad 24 via a thermally conductive film 30c of a known type.

In one or more embodiments, a package molding compound (resin) 22 may then be molded on the assembly resulting from the steps shown in FIGS. 3C and 3D to provide an arrangement where the head portion 30b of the heat sink 30 surfaces at the upper surface of the package 22, e.g., by being flush therewith.

Back etching may then be effected as exemplified in FIG. 3f in order to separate the die pad 14 and the leads 18 in the lead frame.

In one or more embodiments, molding the package resin 22 (as exemplified, e.g., in FIG. 3E) may be by means of film-assisted molding (of a known type).

FIG. 4 is exemplary of the possibility of associating with a structure as exemplified in FIG. 3F one or more printed circuit boards (PCBs) 32a, 32b. In one or more embodiments, such boards may include an electrically insulating (e.g., organic) substrate having electrically conductive lines (so-called tracks or traces) extending at the surface and/or within the body of the board.

For the sake of simplicity, in FIG. 4, only the basic elements of the semiconductor devices 10 illustrated therein are expressly referenced (that is, the semiconductor die 12, the die pad 14, the leads 18, the ground pad 24 and the heat sink 30).

In one or more embodiments the board 32a may provide, e.g., PCB power lines, possibly with the capability of cooperating with the heat sink 30 in facilitating dissipation of heat as produced during operation of the semiconductor dies 12.

In one or more embodiments, the printed circuit board 32b may facilitate providing signal paths, e.g., between the various devices 10. These paths may include, e.g., electrical connection lines between the leads 18 of neighboring devices 10.

FIG. 4 also exemplifies the possibility that the PCBs 32a, 32b may provide, in addition to electrical connection, also mechanical connection between two (or more) semiconductor devices 10. For instance, this may occur by arranging two (or more) devices 10 sandwiched between common PCBs 32a, 32b thus providing mechanical connection between the devices 10.

FIGS. 3A-3F and 4 are thus exemplary of the possibility of exploiting a ground pad 24 (e.g., if attached with a thermally conductive DAF at 24a) in order to facilitate—e.g., in cooperation with the heat sink 30—heat dissipation from the semiconductor die 12.

FIGS. 3A-3F and FIG. 4 are exemplary of the possibility of exploiting the packaging 22 (as possibly provided by film-assisted molding technology) by exposing the top of the structure (e.g., the heat sink 30) in order to provide a ground connection on top of the packaging, e.g., via a PCB 32a.

In that way an integrated heat sink structure may be provided while (as exemplified in FIG. 4) a signal PCB 32b may be provided onto which individual devices (for instance QFN modules) may be coupled, e.g., by soldering.

A "ground" PCB 32a (possibly including simply a metal, e.g., copper sheet) may be provided facilitating operation as a heat sink.

It will be appreciated that an arrangement as exemplified in FIG. 4 may be applied not only for ground connections but also for multiple connections, e.g., at the top surface of the packaging by having one or more pads above the semiconductor die 12.

FIGS. 5A-5E are exemplary of a method adapted for use in one or more embodiments.

FIGS. 5A-5B are exemplary of the provision of basic metal layer 240 (e.g., copper, 0.10 mm. thickness) followed by lamination thereon of an attachment layer 240a, which may include, e.g., a die attach material (or C-DAF).

FIG. 5C is exemplary of subjecting such a (double) laminated layer to singulation to form individual ground pads 24 having an attach layer 24a at the underside thereof.

As exemplified in FIG. 5D, such individual ground pads may then be "picked" and removed from the substrate, e.g., via a thermode (or hot bar) T, e.g., kept at 100° C. to be then (thermally) attached on the semiconductor die 12 as schematically shown in FIG. 5E.

It will be appreciated that in the representation of FIG. 5E, the die pad 14 is represented when still one-piece with the leads 18, to be subsequently separated therefrom, e.g., via back etching as exemplified in FIG. 3F.

In one or more embodiments as exemplified in FIGS. 5A-5E, coupling of the ground pad 24 to the semiconductor die 12 may thus occur via thermal coupling, e.g., via a thermode or hot bar T.

Figure 6:
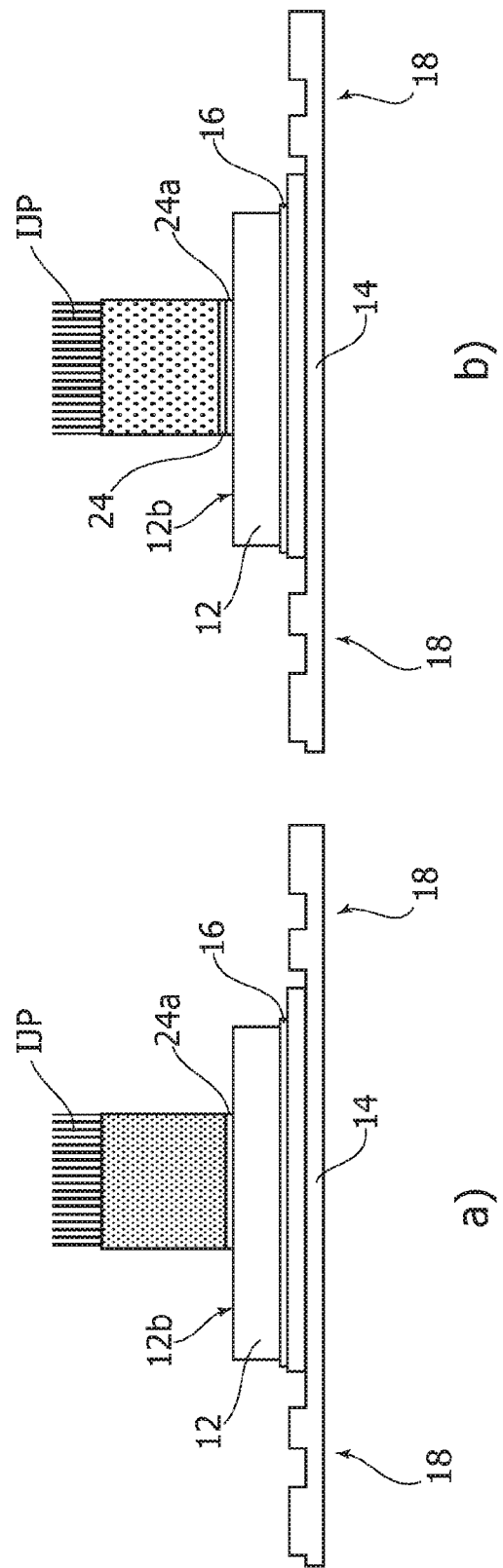
Figure 7:
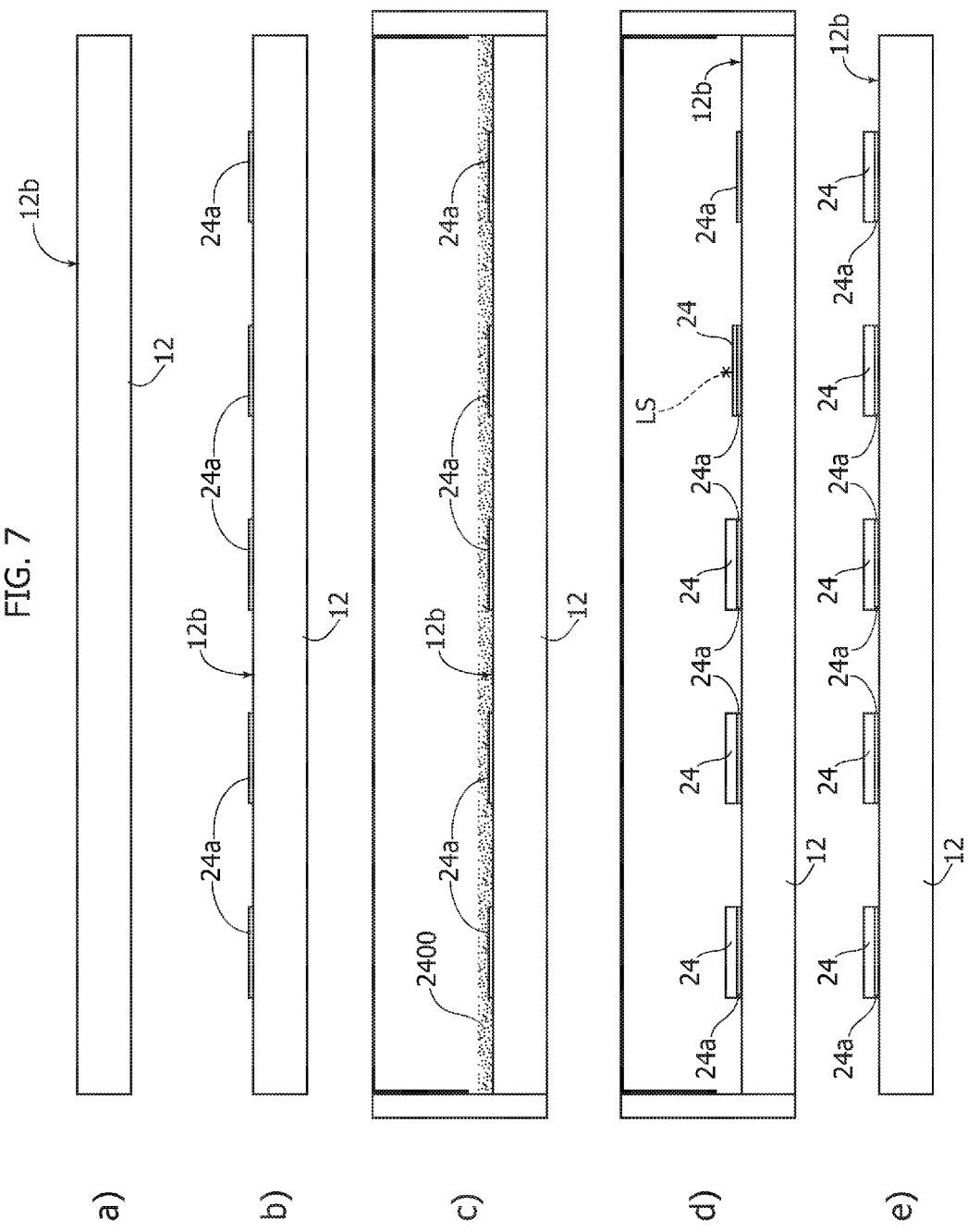

FIGS. 6A-6B are exemplary of one or more embodiments where coupling of the ground pad 24 with the semiconductor die may be via printing, e.g., ink-jet printing (ink-jet printer IJP) or aerosol printing.

One or more embodiments may thus involve printing onto the top surface 12b of the semiconductor die 12 (already attached to the die pad 14, which is again assumed to be still one-piece with the lead frame 18) an electrically insulating (dielectric) ink—as exemplified at 24a in FIG. 6A.

In one or more embodiments this may be followed (see FIG. 6B) by printing an electrically conductive ink 24.

The dielectric ink available under the trade name of Tayo UPIX may be eligible for providing the layer 24a with a thickness of, e.g., 20-30 micron (1 micron=$10^{-6}$ m).

An Ag-filled ink with a thickness of 10-20 micron (1 micron=$10^{-6}$ m) may be exemplary of an ink adapted to provide a ground pad 24.

UV curing may facilitate solidification of the ink(s) printed after dispensing.

Such a jet dispense process may take place (e.g., via an ink-jet printing head UP of a known type) either at wafer or strip level.

FIGS. 7A-7E are exemplary of providing one or more ground pads 24 onto (the top surface 12b of) a semiconductor wafer to be possibly singulated to provide individual semiconductor dies 12.

FIG. 7B is exemplary of the possibility of providing (e.g., by screen printing) dielectric layers 24a onto a semiconductor wafer 12 as shown in FIG. 7A.

For instance, the layers 24a may include screen-printed dielectric B stage Henkel 8006 Ink having a thickness of about 50+/−10 micron (1 micron=$10^{-6}$ m), possibly subjected to heat pre-curing at, e.g., 100-120° C.

FIG. 7C is exemplary of the possibility of distributing over the wafer 14, having the layers 24a thereon, metallic powder (e.g., a copper powder bed) to be sintered, e.g., by laser sintering (as schematically indicated by LS in FIG. 7D) at the locations of the layers 24a.

Such (localized) sintering LS may thus result in the formation of ground pads 24 at corresponding locations of the wafer 12. These ground pads 24 may then be coupled (possibly after singulation) to the other elements of the device structure as exemplified in the foregoing.

Again, it will be appreciated that features exemplified herein in connection with a certain figure may be applied (singly or in combination with other features) also to embodiments exemplified in other figures.

In that respect, in one or more embodiments where the semiconductor die 12 is already provided with an upper insulating (e.g., polyimide) layer, a dielectric layer 24a (however provided) may be dispensed with.

FIGS. 5A to 7E are thus intended to be generally exemplary of features of various methods which may be applied to manufacturing semiconductor devices according to one or more embodiments.

FIGS. 5A-5E are thus generally exemplary of the possibility of providing a ground pad 24 by attaching a shaped metal slide with a die attach film (DAF) with such metal slide adapted to be cut from a metal sheet (see, e.g., the singulation step of FIG. 5C) after lamination using standard processes.

FIGS. 6A-6B generally exemplary of the possibility of providing a ground pad 24 by using a jet printer (e.g., IP) or aerosol equipment to provide a (first) layer of dielectric ink 24a, possibly curing it, e.g., with UV radiation, followed by printing a conductive ink 24, e.g., filled with a metal (e.g., Cu, Al, Ag or carbon microparticles—optionally with a size of 1-2 micron (1 micron=$10^{-6}$ m), with possible final UV curing.

FIGS. 7A-7E are generally exemplary of the possibility of providing a ground pad 24 by a 3D printing technology, e.g., by providing a particle bed (e.g., Cu) on a wafer surface covering the entire wafer 12 followed by laser sintering (melting) locally at the intended ground pad locations.

As indicated, features and details exemplified herein in connection with one of the figures may be applied also to embodiments as exemplified in other figures.

Figure 8:
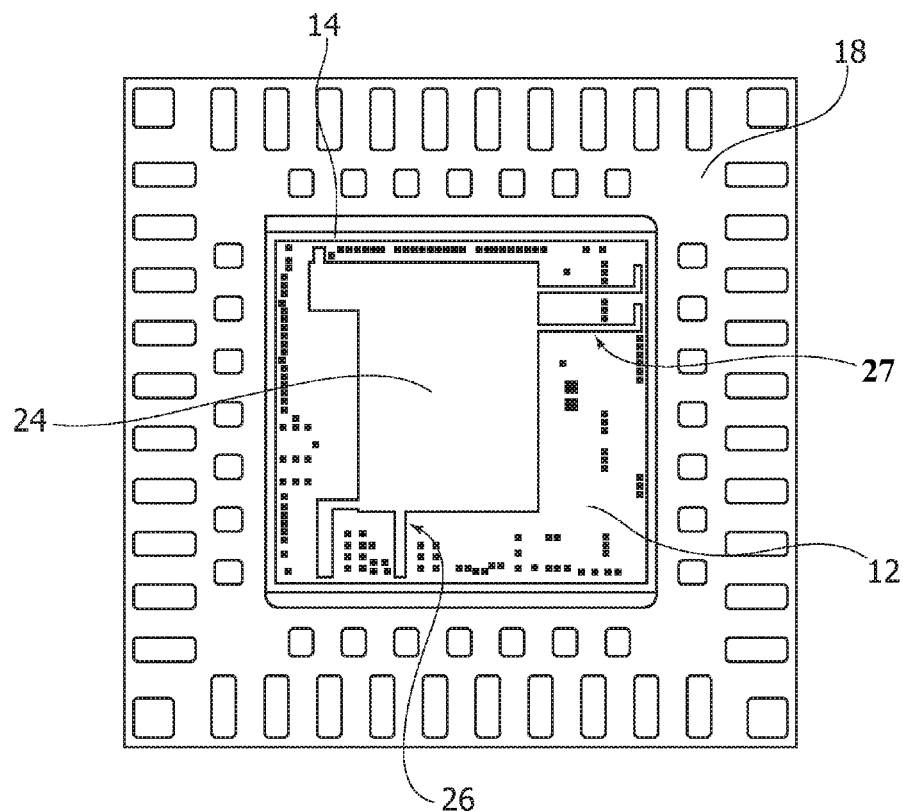
FIGS. 8, 9 and 10 are exemplary of various features applicable to embodiments.
Figure 9:
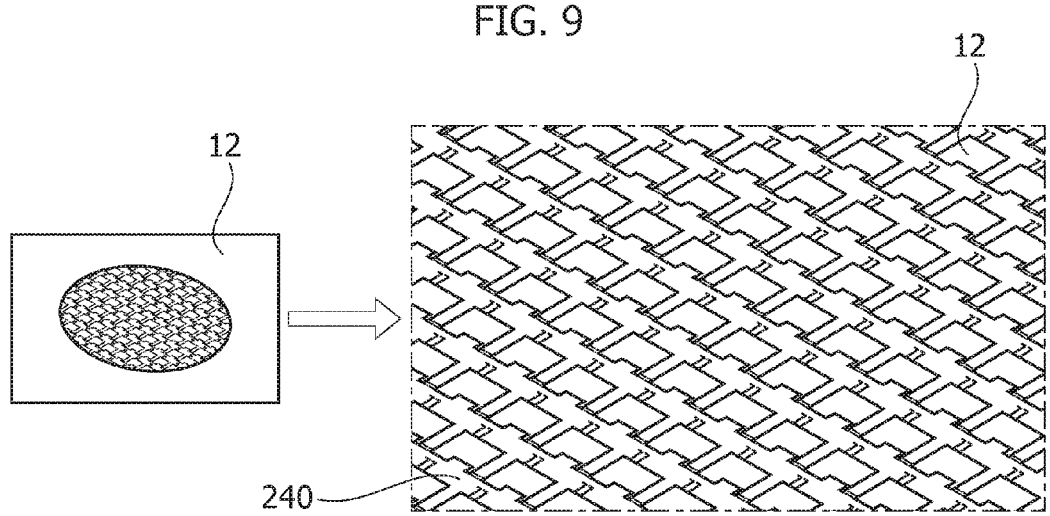
Figure 10:
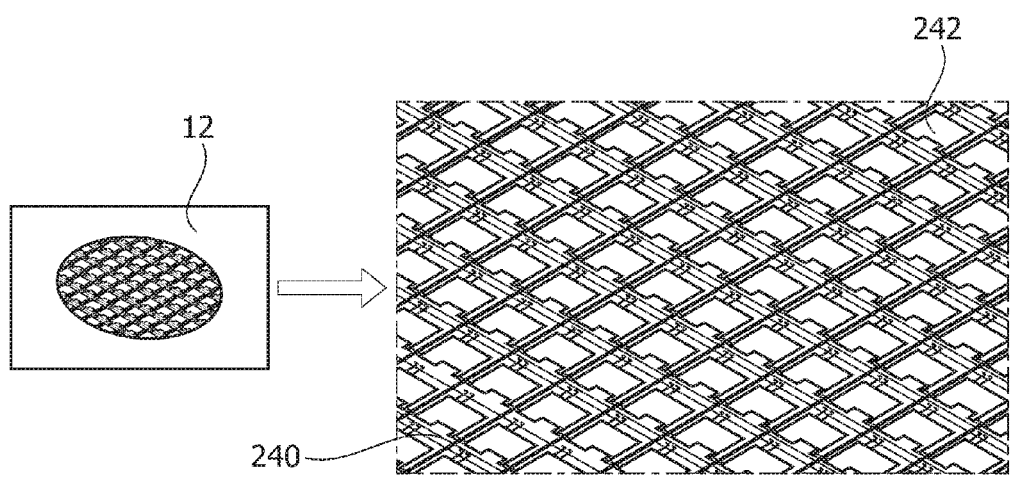

For instance, by way of comparison with, e.g., FIG. 2, FIG. 8 is exemplary of the possibility, in one or more embodiments, of providing the ground connection(s) 26 between ground terminals of the semiconductor die 12 (located, e.g., at the upper or front surface 12b thereof) and the ground pad 24, wholly or partly, via electrically conductive tracks possibly formed together with the ground pad 24.

In connection with, e.g., FIGS. 6A-6B, FIGS. 9 and 10 are exemplary of applying onto the die 12 an, e.g., screen printed protective water cleaning material (watermask) 240 with application of an, e.g., screen printed dielectric B stage Henkel 8006 Ink having, subjected to heat pre-curing at, e.g., 100° C. and jet printing Ag filled ink 242 with, e.g., UV curing after dispense (before or after protective mask removal.

One or more embodiments may thus provide a semiconductor device (e.g., 10) including:
 a semiconductor die (e.g., 12) having first (e.g., 12a) and second (e.g., 12b) opposite surfaces,
 a die pad (e.g., 14) having the first surface of the semiconductor die attached (e.g., by film 16) thereon,
 an electrically conductive ground pad (e.g., 24) at the second surface of the semiconductor die,
 a device package (e.g., 22) coupled with the semiconductor die with said ground pad lying between the semiconductor die and the package, and
 at least one (electrical) ground connection (e.g., wires or tracks 26 in FIGS. 2 and 6A-6B) for the semiconductor die between the second surface of the semiconductor die and said ground pad.

One or more embodiments may include at least one further ground connection (e.g., a single wire 28) between said ground pad at the second surface of the semiconductor die and said die pad having the first surface of the semiconductor die attached thereon.

One or more embodiments may include:
 a set of leads (e.g., 18) peripherally of said die pad,
 a wire bonding network (e.g., 20) between said semiconductor die and said set of leads.

One or more embodiments may include a heat sink (e.g., 30) thermally coupled (e.g., at 30c) with said ground pad and extending towards the outer surface of the device package.

One or more embodiments may include a thermally conductive layer (e.g., 30c) between said ground pad and said heat sink.

In one or more embodiments:
 the device (10) may include opposite front and back sides or surfaces, with said ground pad and said die pad facing towards said front side and said back side or surface, respectively,
 at least one circuit board (e.g., 32a, 32b) may be coupled with at least one of said front side and said back side or surface of the device.

In one or more embodiments the device may include first (e.g., 32a) and second (e.g., 32b) circuit boards coupled with said front side and said back side.

In one or more embodiments, an arrangement may include a plurality of semiconductor devices according to one or more embodiments, with said plurality of semiconductor devices sandwiched between common first and second circuit boards coupled with the front side and the back side of the devices of said plurality (see, e.g., FIG. 4).

One or more embodiments may provide a method of manufacturing a semiconductor device according to one or more embodiments, wherein the method may include one of:
 i) attaching, optionally by thermal attachment (e.g., T in FIGS. 5D-5E), said ground pad onto said second surface of the semiconductor die, or
 ii) ink printing (see, e.g., UP in FIGS. 6A-6B and FIGS. 9 and 10) said ground pad onto said second surface of the semiconductor die, or
 iii) providing a bed (see, e.g., 2400 in FIG. 7C) of electrically conductive powder material over said second surface of the semiconductor die and sintering, optionally by laser sintering, said conductive powder material.

Without prejudice to the underlying principles, the details and embodiments may vary, even significantly, with respect to what has been described by way of example only without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device comprising:
 a semiconductor die having opposite first and second surfaces,
 a die pad, the first surface of the semiconductor die being attached on the die pad,
 an electrically conductive ground pad at the second surface of the semiconductor die,
 a device package coupled with the semiconductor die, with said ground pad lying between the semiconductor die and the package, and
 a first ground connection electrically connecting the second surface of the semiconductor die and said ground pad.

2. The semiconductor device of claim 1, including a second ground connection electrically connected between said ground pad and said die pad.

3. A semiconductor device according to claim 1, including:
 a set of conductive leads peripherally of said die pad, and
 a wire bonding network electrically connected between said semiconductor die and said set of leads.

4. The semiconductor device of claim 1, including a heat sink thermally coupled with said ground pad and extending to an outer surface of the device package.

5. The semiconductor device of claim 4, including a thermally conductive layer between said ground pad and said heat sink.

6. The semiconductor device of claim 1, comprising:
opposite front and back sides, with said ground pad and said die pad facing towards said front side and said back side, respectively, and
at least one circuit board is coupled with at least one of said front side and said back side of the device.

7. The semiconductor device of claim 6, wherein the at least one circuit board includes first and second circuit boards coupled with said front side and said back side, respectively.

8. An arrangement comprising:
a plurality of semiconductor devices according to claim 7, each semiconductor device including:
opposite front and back sides;
a semiconductor die having opposite first and second surfaces;
a die pad facing toward said back side, the first surface of the semiconductor die being attached on the die pad;
an electrically conductive ground pad at the second surface of the semiconductor die, the ground pad facing toward the front side;
a device package coupled with the semiconductor die, with said ground pad lying between the semiconductor die and the package; and
a first ground connection electrically connecting the second surface of the semiconductor die and said ground pad; and
first and second circuit boards coupled with the front side and the back side of the devices of said plurality.

9. The arrangement of claim 8, wherein each device includes a second ground connection electrically connected between said ground pad and said die pad.

10. The arrangement of claim 8, wherein each device includes:
a set of conductive leads peripherally of said die pad, and
a wire bonding network electrically connected between said semiconductor die and said set of leads.

11. The arrangement of claim 8, wherein each device includes a heat sink thermally coupled with said ground pad and extending to an outer surface of the device package.

12. The arrangement of claim 11, wherein each device includes a thermally conductive layer between said ground pad and said heat sink.

13. A method, comprising:
manufacturing a semiconductor device, the manufacturing including:
attaching a semiconductor die, having opposite first and second surfaces, to a die pad, the first surface of the semiconductor die being attached on the die pad;
forming an electrically conductive ground pad at the second surface of the semiconductor die;
forming a device package coupled with the semiconductor die, with said ground pad lying between the semiconductor die and the package; and
a first ground connection electrically connecting the second surface of the semiconductor die and said ground pad.

14. The method of claim 13, comprising attaching said ground pad onto said second surface of the semiconductor die.

15. The method of claim 14, wherein attaching said ground pad onto said second surface of the semiconductor die includes thermally attaching said ground pad to said second surface.

16. The method of claim 13, wherein forming said ground pad includes ink printing said ground pad onto said second surface of the semiconductor die.

17. The method of claim 13, wherein forming said ground pad includes
providing a bed of electrically conductive powder material over said second surface of the semiconductor die; and
sintering said conductive powder material.

18. The method of claim 13, wherein the sintering includes laser sintering said conductive powder material.

* * * * *